United States Patent
Wu

(10) Patent No.: US 6,300,189 B1
(45) Date of Patent: Oct. 9, 2001

(54) METHOD FOR FORMING A METAL CAPACITOR

(75) Inventor: Bing-Chang Wu, Hsin-Chu Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/620,239

(22) Filed: Jul. 20, 2000

(51) Int. Cl.⁷ .................................................. H01L 21/8242
(52) U.S. Cl. ............................................. 438/239; 438/637
(58) Field of Search ...................... 438/239, 243, 438/244, 253, 386, 387, 396, 626, 637, 672, 675, 706, 712, 959

(56) References Cited

U.S. PATENT DOCUMENTS 5,926,359 * 7/1999 Greco et al. ............................ 361/311
6,025,226 * 2/2000 Gambino et al. ...................... 438/244
6,144,051 * 11/2000 Nishimura et al. .................... 257/277
6,166,423 * 12/2000 Gambino et al. ...................... 257/532

* cited by examiner

Primary Examiner—David Nelms
Assistant Examiner—David Nhu
(74) Attorney, Agent, or Firm—Winston Hsu

(57) ABSTRACT

A semiconductor wafer has a dielectric layer. A bottom plate recess is first formed in the dielectric layer, and a metal bottom plate is formed in the bottom plate recess. An insulation layer is formed on the metal bottom plate, and a via hole is formed in the insulation layer. A first metal layer is then formed on the insulation layer that fills the via hole so as to form a via plug. Finally, a metal upper plate is formed on the insulation layer, and a metal wire is formed on top of the via plug.

13 Claims, 3 Drawing Sheets

METHOD FOR FORMING A METAL CAPACITOR

BACKGROUND OF THE INVENTION

1. Field of the Invention

The present invention relates to a method for forming a metal capacitor on a semiconductor wafer, and more particularly, to a method for forming a metal capacitor that is formed of metal-insulator-metal (MIM).

2. Description of the Prior Art

In semiconductor manufacturing processes, metal capacitors formed of metal-insulator-metal (MIM) are widely used in the design of the semiconductor devices. Because a MIM capacitor has low resistance and low parasitic capacitance, and has no problems in shifts of depletion induced voltage, MIM capacitors have become the main structure used for metal capacitors.

Please refer to FIG. 1 and FIG. 2. FIG. 1 and FIG. 2 are schematic diagrams of a method for forming a metal capacitor 26 on a semiconductor wafer 10 according to the prior art. As shown in FIG. 1, the semiconductor wafer 10 includes a substrate (not shown), and a dielectric layer 12 positioned on the substrate. In the prior art method, a chemical vapor deposition (CVD) process is performed to evenly deposit a metal layer on the surface of the dielectric layer 12. After defining the patterns of the metal bottom plate 14, an etching process is performed to remove excess portions of the metal layer so as to form the metal bottom plate 14. An insulation layer and another metal layer are then deposited, in order, on the surface of the metal bottom plate 14. A lithographic process is performed to define the patterns of a metal upper plate 18, and the excess portions of metal layer and insulation layer are removed to form the inter-metal insulator (IMI) 16 and the metal upper plate 18 so as to finish the formation of the metal capacitor 26.

As shown in FIG. 2, an inter-metal dielectric (IMD) layer 20 covers the metal capacitor 26, and a chemical mechanical polishing (CMP) process is used to planarize the surface of the inter-metal dielectric layer 20. A photoresist layer (not shown) is coated on the surface of the inter-metal dielectric layer 20, and a lithographic process is performed to define the position of via holes 28. The excess portions of the photoresist layer are then removed, and a dry etching process is performed, using the residual photoresist layer as a mask. The inter-metal dielectric layer 20 that is not covered by the mask is removed so as to form the via holes 28. The residual photoresist layer is then stripped.

A sputtering process is performed to form a metal layer (not shown) that fills the via holes 28. An etching back process is then performed to remove portions of the metal layer till the surface of the metal layer in the via holes 28 are aligned with the surface of the inter-metal dielectric layer 20 so as to form the via plugs 22. A metal layer (not shown) is then evenly deposited on the surface of the inter-metal dielectric layer 20, and an etching process is performed to form a metal wire 24 on top of the via plugs 22. The via plugs 22 are used to electrically connect the metal wire 24 and the metal capacitor 26.

In the prior art method, the metal capacitor 26 is formed on the semiconductor wafer 10 first, and several via plugs 22 are formed in the inter-metal dielectric layer 20 to electrically connect to the metal wire 24. This method makes good use of the low resistance and low parasitic capacitance of the metal capacitor 26. However, in order to reduce the resistance between the metal wire 24 and the metal capacitor 26, and to increase the current transmission speed, a great deal of area and space on the semiconductor wafer 10 must be used to form several via plugs 22. As shown in FIG. 2, in order to reduce the resistance between the metal capacitor 26 and the metal wire 24, the prior art method needs most of the space of the inter-metal dielectric layer 20 to form the via plugs 22. Waste of the area of wafer 10 may thus result. Furthermore, the prior art method needs additional regions on the wafer 10 to form the locally connected metal layer.

As the line width of semiconductor devices shrinks, how to increase the integration density of the devices on the semiconductor wafer 10, and how to reduce the area used on the wafer 10 so as to promote throughout, has become an important issue in the field of semiconductor manufacturing.

SUMMARY OF THE INVENTION

It is therefore a primary objective of the present invention to provide a method form forming a metal capacitor on a semiconductor wafer to increase the integration of semiconductor devices.

In a preferred embodiment, the semiconductor wafer includes a dielectric layer. A bottom plate recess is formed in the dielectric layer first, and a metal bottom plate is formed in the bottom plate recess. An insulation layer is formed on the metal bottom plate, and a via hole is formed in the insulation layer. A first metal layer is then formed on the insulation layer that fills the via hole so as to form a via plug. Finally, a metal upper plate is formed on the insulation layer, and a metal wire is formed on top of the via plug.

It is an advantage of the present invention that the metal bottom plate of the metal capacitor is embedded into the inter-metal dielectric layer, and further forms the metal wire and the metal upper plate simultaneously, so that the present invention reduces the space required for forming the metal capacitor to increase the integration density of devices on the semiconductor wafer.

These and other objectives of the present invention will no doubt become obvious to those of ordinary skill in the art after reading the following detailed description of the preferred embodiment, which is illustrated in the various figures and drawings.

DETAILED DESCRIPTION OF THE PREFERRED EMBODIMENT

Figure 3:
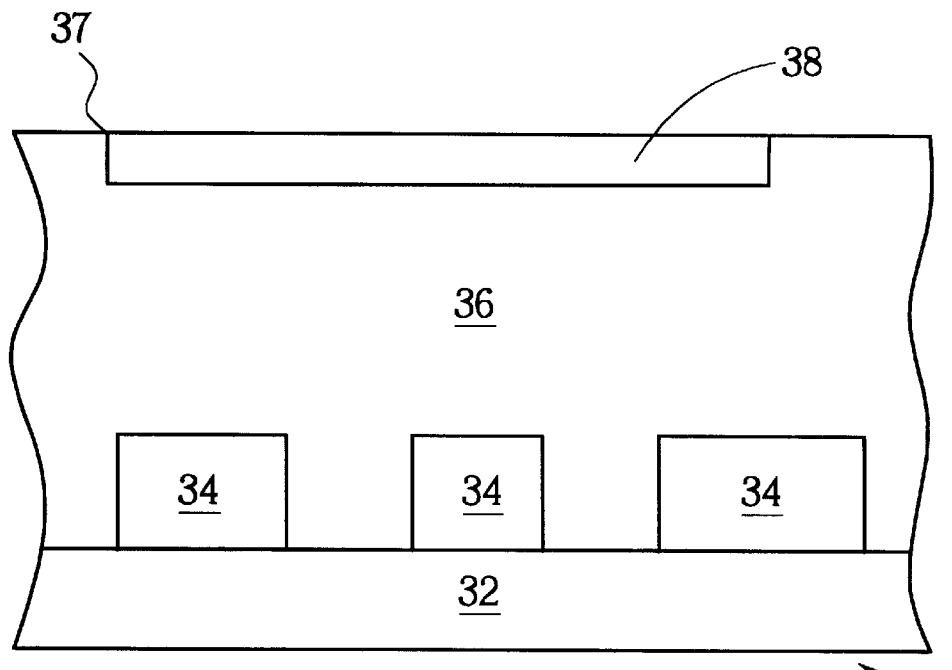
FIG. 3 to FIG. 5 are schematic diagrams of a method for forming a metal capacitor on a semiconductor wafer according to the present invention.
Figure 4:
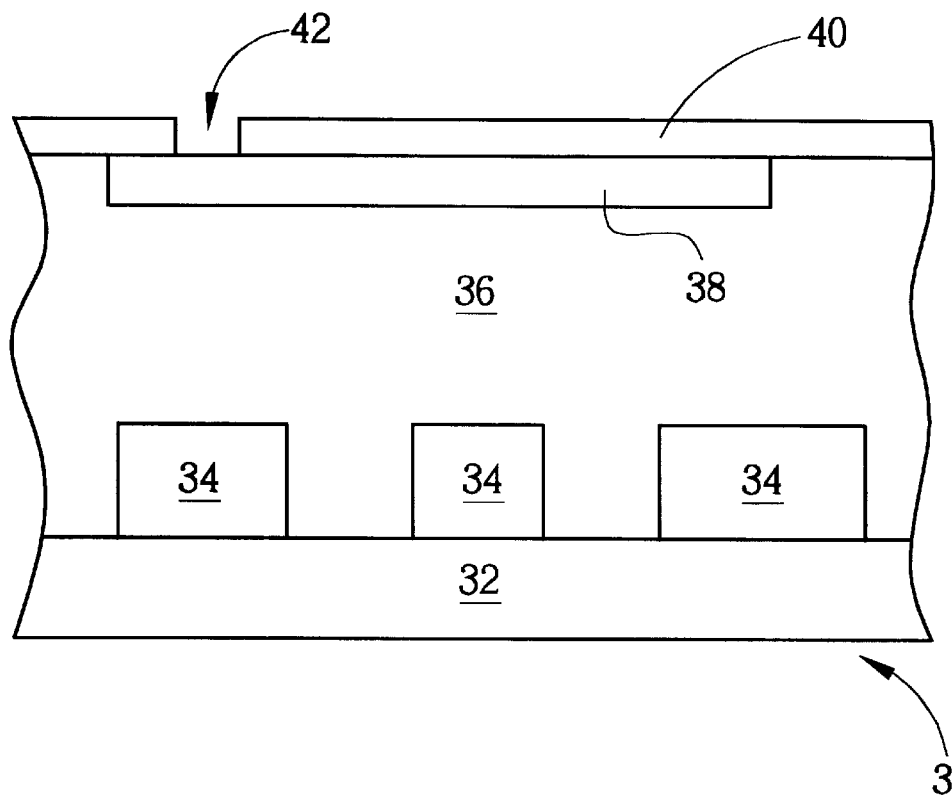
Figure 5:
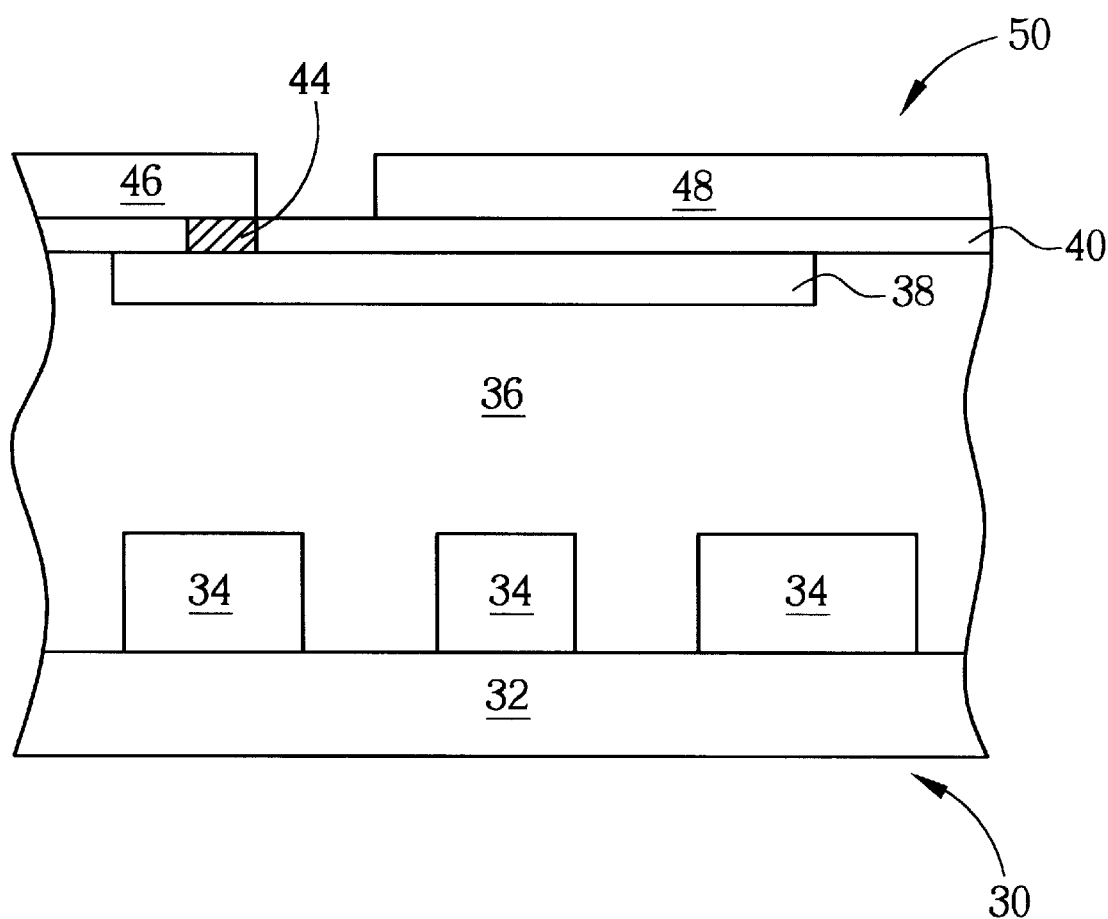

Please refer to FIG. 3 to FIG. 5. FIG. 3 to FIG. 5 are schematic diagrams of a method for forming a metal capacitor 50 on a semiconductor wafer 30 according to the present invention. As shown in FIG. 3, the semiconductor wafer 30 includes a substrate (not shown), and a dielectric layer 32 positioned on the substrate. A metal layer 34, used for locally connecting, is formed on the dielectric layer 32. The method for forming the locally connected metal layer 34 involves first depositing a metal layer (not shown) on the surface of the dielectric layer 32, and performing a lithographic process to define the patterns of the locally connected wires. Finally, a dry etching process is performed to remove the portions that are not covered by the mask so as to form the locally connected metal layer 34 shown in FIG. 3.

In the present invention method, an inter-metal dielectric layer 36 is deposited evenly on the dielectric layer 32 and the locally connected metal layer 34. A photoresist layer (not shown) is then coated on the surface of the inter-metal dielectric layer 36, and a lithographic process is used to define the patterns of a bottom plate recess 37. The excess portions of the photoresist layer are removed, and a dry etching process is performed using the residual photoresist layer as a mask to remove portions of the inter-metal dielectric layer 36 that are not covered by the mask so as to form the bottom plate recess 37. The residual photoresist layer is then stripped.

A chemical vapor deposition (CVD) process, or a physical vapor deposition process, is performed to form a metal layer on the surface of the inter-metal dielectric layer 36 and in the bottom plate recess 37. Then a planarization process is performed to remove portions of the metal layer until the surface of the metal layer is aligned with the surface of the inter-metal dielectric layer 36 so as to form the metal bottom plate 38 in the bottom plate recess 37. The planarization process can be a chemical mechanical polishing (CMP) process, or an etching back process.

As shown in FIG. 4, an inter-metal insulator (IMI) 40 is deposited on the surface of the metal bottom plate 38. A lithographic process is used to define the position of a via hole 42, and a dry etching process, or a wet etching process, is performed to form a via hole 42 in the insulation layer 40. The formation of the via hole 42 can be integrated with the formation of via holes in other regions of the semiconductor wafer 30, to form all via holes together in one etching step.

As shown in FIG. 5, a metal layer (not shown) is formed on the surface of the insulation layer 40 that fills the via hole 42 to form a via plug 44. A photoresist layer is then coated on the metal layer, and a lithographic process is performed to define patterns of a metal upper plate 48 and a metal wire 46. The excess portions of the photoresist layer are removed, and a dry etching process uses the residual photoresist layer as a mask to remove portions of the metal layer that are not covered by the mask to form the metal upper plate 48 and the metal wire 46. The residual photoresist layer is then stripped.

In the preferred embodiment of the present invention, the metal layer used to form the metal upper plate 48 simultaneously fills the via hole 42 and forms the via plug 44, so the process steps are simplified. If an integrated process is considered, such as another via plug needing to be formed in other regions of the semiconductor wafer 30, the via plug 44 and the metal upper plate 48 or the metal wire 46 can be formed in separate steps. For example, a sputter process can be used to form a metal layer filling the via hole 42, and an etching back process can then be performed to form the via plug 44. A metal layer would then be deposited onto the surface of the insulation layer 40, and after defining the patterns, an etching process would be used to form the metal upper plate 48 and to form the metal wire 46 on top of the via plug 44.

Figure 1:
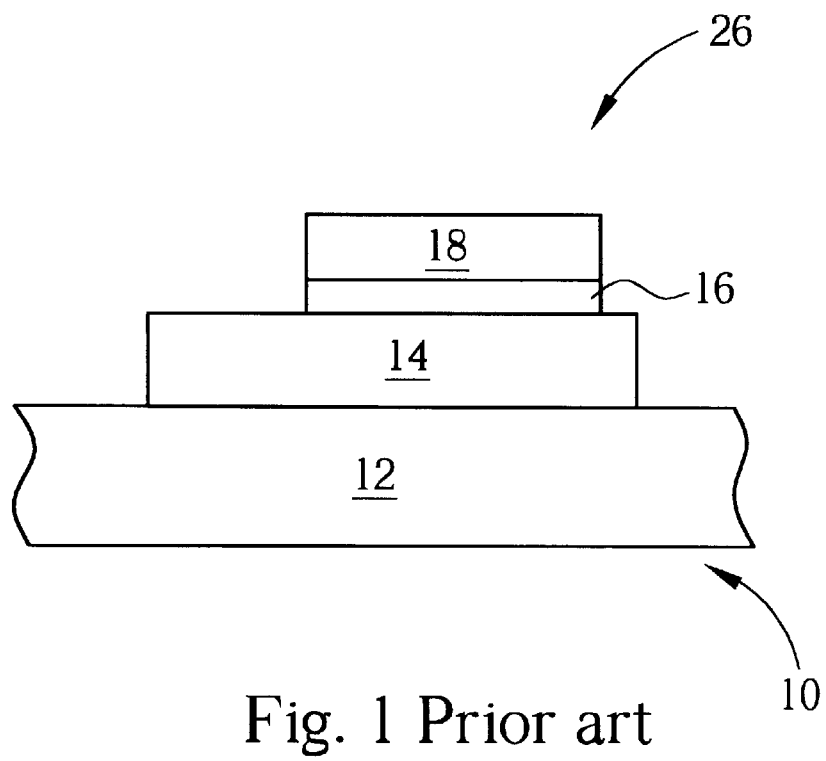
FIG. 1 and FIG. 2 are schematic diagrams of a method for forming a metal capacitor on a semiconductor wafer according to the prior art.
Figure 2:
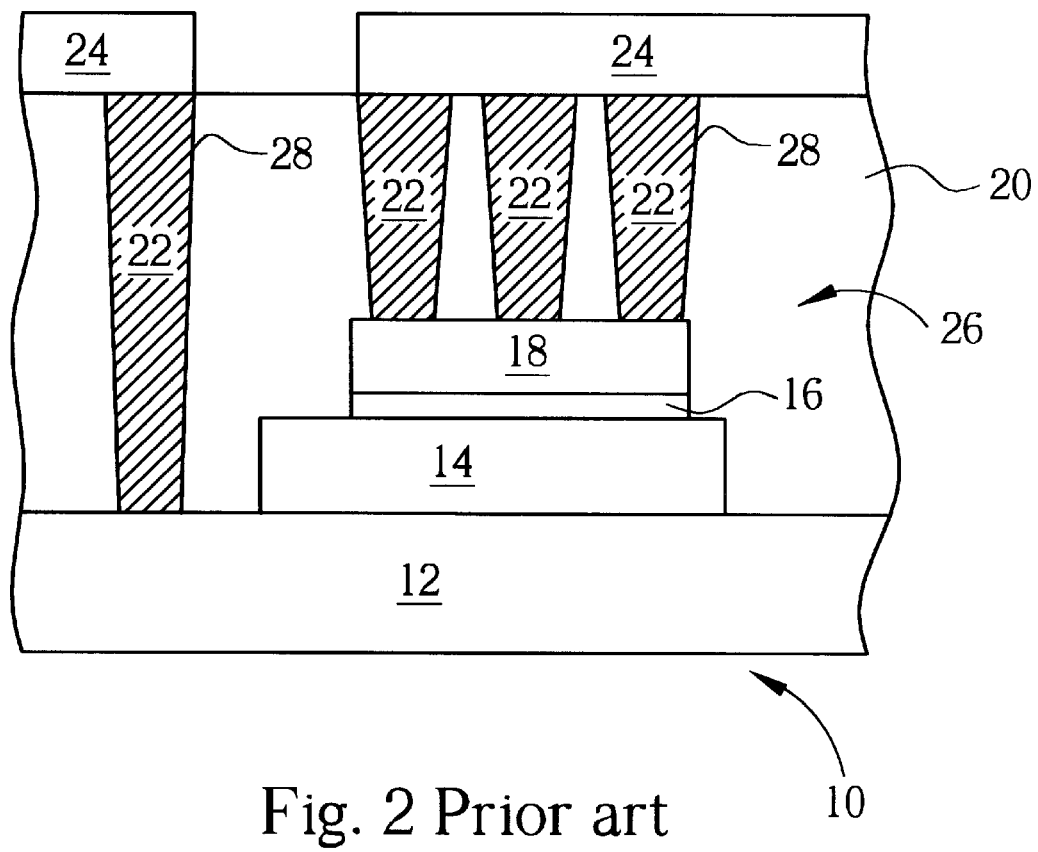

As shown in FIG. 5, the present invention embeds the metal bottom plate 38 of the metal capacitor 50 in the inter-metal dielectric layer 36. Then an inter-metal insulation layer 40 and a metal upper plate 48 are formed, in order, on the surface of the metal bottom plate 38, and the other side of the metal bottom plate 38 is electrically connected to the metal wire 46. Hence, the present invention not only takes advantage of the low resistance and low parasitic capacitance of a MIM capacitor, it also requires less area and space on the semiconductor wafer 30 to form the metal bottom plate 38 and the via plug 44. In contrast to the metal capacitor 26 formed by the prior art method (as shown in FIG. 2), the space saved under the metal capacitor 50 can be used to form the locally connected metal layer 34. Furthermore, the via plug 44 can simultaneously be formed with the metal wire 46 and the metal upper plate 46 to reduce process steps and costs.

In contrast to the prior art metal capacitor 26, which needs much more space to form the via plugs 22 to electrically connect to the metal wire 24, the present invention embeds the metal bottom plate 38 of the metal capacitor 50 in the inter-metal dielectric layer 36, and further forms the metal wire 46 and the metal upper plate 48 simultaneously. Hence, the present invention saves space on the wafer when forming the metal capacitor 50, thus increasing the integration density of devices on the wafer to further enhance throughout and reduce cost.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method for forming a metal capacitor on a semiconductor wafer and simultaneously forming a metal wire to electrically connect with the metal capacitor, the semiconductor wafer comprising a dielectric layer, the method comprising:

forming a bottom plate recess in the dielectric layer;

forming a metal bottom plate in the bottom plate recess;

forming an insulation layer on the metal bottom plate and on the dielectric layer;

forming a via hole in the insulation layer through to the surface of the metal bottom plate;

forming a via plug in the via hole to connect with the metal bottom plate; and forming a metal upper plate on portions of the insulation layer and the metal wire on the other portions of the insulation layer to connect with a top of the via plug;

wherein the metal upper plate, the portions of the insulation layer under the metal upper plate, and the metal bottom plate are stacked together forming the metal capacitor, and the metal wire electrically connects to the metal bottom plate via the via plug.

2. The method of claim 1 wherein the method for forming the bottom plate recess comprises:

forming a first photoresist layer on the dielectric layer;

performing a lithographic process to define patterns of the bottom plate recess;

removing excess portions of the first photoresist layer;

performing a first dry etching process using the residual first photoresist layer as a mask to remove portions of the dielectric layer that are not covered by the mask so as to form the bottom plate recess; and stripping the residual first photoresist layer.

3. The method of claim 1 wherein the method for forming the metal bottom plate comprises:

forming a first metal layer on the surface of the dielectric layer and in the bottom plate recess; and performing a planarization process to remove portions of the first metal layer until the surface of the first metal layer in the bottom plate recess is aligned with the surface of the dielectric layer so as to form the metal bottom plate.

4. The method of claim 3 wherein the planarization process is a chemical mechanical polishing (CMP) process.

5. The method of claim 1 wherein the method for forming the via plug comprises:

forming a second metal layer on the insulation layer that fills the via hole;

performing an etching back process to remove excess portions of the second metal layer so that the surface of the second metal layer in the via hole is aligned with the surface of the insulation layer so as to form the via plug.

6. The method of claim 1 wherein the method for forming the metal upper plate comprises:

forming a third metal layer on the insulation layer and on the top of the via plug;

forming a second photoresist layer on the third metal layer;

performing a lithographic process to define patterns of the metal upper plate and the metal wire;

removing excess portions of the second photoresist layer;

performing a second dry etching process using the residual second photoresist layer as mask to remove portions of the third metal layer that are not covered by the mask so as to form the metal upper plate and the metal wire; and stripping the residual second photoresist layer.

7. The method of claim 1 wherein the semiconductor wafer further comprises a substrate, and a locally connected metal layer positioned on the substrate, and the dielectric layer covers the locally connected metal layer.

8. A method for forming a metal capacitor on a semiconductor wafer and simultaneously forming a metal wire to electrically connect with the metal capacitor, the semiconductor wafer comprising a dielectric layer, the method comprising:

forming a bottom plate recess in the dielectric layer;

forming a metal bottom plate in the bottom plate recess;

forming an insulation layer on the metal bottom plate and on the dielectric layer;

forming a via hole in the insulation layer through to the surface of the metal bottom plate;

forming a first metal layer on the insulation layer that fills the via hole so as to form a via plug to connect with the metal bottom plate; and forming a metal upper plate on portions of the insulation layer, and the metal wire on the other portions of the insulation layer to connect with a top of the via plug;

wherein the metal upper plate, the portions of the insulation layer under the metal upper plate, and the metal bottom plate are stacked together forming the metal capacitor, and the metal wire electrically connects to the metal bottom plate via the via plug.

9. The method of claim 8 wherein the method for forming the bottom plate recess comprises:

forming a first photoresist layer on the dielectric layer;

performing a lithographic process to define patterns of the bottom plate recess;

removing excess portions of the first photoresist layer;

performing a first dry etching process using the residual first photoresist layer as a mask to remove portions of the dielectric layer that are not covered by the mask so as to form the bottom plate recess; and stripping the residual first photoresist layer.

10. The method of claim 8 wherein the method for forming the metal bottom plate comprises:

forming a second metal layer on the surface of the dielectric layer and in the bottom plate recess; and performing a planarization process to remove portions of the second metal layer until the surface of the second metal layer is aligned with the surface of the dielectric layer so as to form the metal bottom plate.

11. The method of claim 10 wherein the planarization process is a chemical mechanical polishing (CMP) process.

12. The method of claim 8 wherein the method for forming the metal upper plate and the metal wire comprises:

forming a second photoresist layer on the first metal layer;

performing a lithographic process to define patterns of the metal upper plate and the metal wire;

removing excess portions of the second photoresist layer;

performing a second dry etching process using the residual second photoresist layer as a mask to remove portions of the first metal layer that are not covered by the mask so as to form the metal upper plate and the metal wire; and stripping the residual second photoresist layer.

13. The method of claim 8 wherein the semiconductor wafer further comprises a substrate, and a locally connected metal layer positioned on the substrate, and the dielectric layer covers the locally connected metal layer.

* * * * *